(12) United States Patent
Stillwell et al.

(10) Patent No.: US 12,061,287 B2
(45) Date of Patent: Aug. 13, 2024

(54) DIFFERENTIAL ABSORPTION LIDAR FOR PROFILING TEMPERATURE

(71) Applicants: UNIVERSITY CORPORATION FOR ATMOSPHERIC RESEARCH, Boulder, CO (US); MONTANA STATE UNIVERSITY, Bozeman, MT (US)

(72) Inventors: Robert Stillwell, Broomfield, CO (US); Scott Spuler, Westminster, CO (US); Matthew Hayman, Boulder, CO (US); Kevin S. Repasky, Bozeman, MT (US)

(73) Assignees: University Corporation for Atmospheric Research, Boulder, CO (US); Montana State University, Bozeman, MT (US)

( * ) Notice: Subject to any disclaimer, the term of this patent is extended or adjusted under 35 U.S.C. 154(b) by 576 days.

(21) Appl. No.: 17/294,673

(22) PCT Filed: Nov. 30, 2018

(86) PCT No.: PCT/US2018/063360
§ 371 (c)(1),
(2) Date: May 17, 2021

(87) PCT Pub. No.: WO2020/112140
PCT Pub. Date: Jun. 4, 2020

(65) Prior Publication Data
US 2021/0405207 A1    Dec. 30, 2021

(51) Int. Cl.
*G01S 7/48* (2006.01)
*G01S 7/481* (2006.01)
(Continued)

(52) U.S. Cl.
CPC ............ *G01S 7/4815* (2013.01); *G01S 7/484* (2013.01); *G01S 17/86* (2020.01); *G01S 17/95* (2013.01); *H01S 5/005* (2013.01)

(58) Field of Classification Search
CPC ........ G01S 7/4815; G01S 7/484; G01S 17/86; G01S 17/95; H01S 5/005
See application file for complete search history.

(56) References Cited

U.S. PATENT DOCUMENTS 5,250,810 A    10/1993  Geiger
8,229,679 B1 *  7/2012  Matthews ............... G01S 17/88
                                                       250/343

(Continued)

OTHER PUBLICATIONS

Kenji Numata et al: "Fast-switching methane lidar transmitter based on a seeded optical parametric oscillator", Applied Physics B: Lasers and Optics., vol. 116, No. 4, Feb. 17, 2014 (Feb. 17, 2014), pp. 959-966, XP055336401, DE ISSN: 0946-2171, DOI: 10.1007/s00340-014-5783-4, chapters 2.1, 2.3, 2.4; figures 1, 7.

(Continued)

*Primary Examiner* — Randy W Gibson
(74) *Attorney, Agent, or Firm* — The Ollila Law Group LLC

(57) ABSTRACT

A beam transmitter, a receiver, and a LIDAR, along with methods to operate each are provided. The beam transmitter comprises a first and a second transmission channel (201a, 201b), each transmission channel including a first online laser, a first offline laser, and a first laser transmission selection switch operable to toggle between including the first online laser signal and the first offline laser signal in a first transmission beam. The beam transmitter further includes at least one light redirection device operable to coalign the first transmission beam with the second transmission beam. The receiver comprises a first splitter (402a, 402b), a first filter (404a, 404b), a first detector channel (406a, 406b), a second splitter (408a, 408b), a second filter (410a, 410b), and a second detector channel (412a, 412b). The LIDAR includes the beam transmitter, the receiver, and a shared telescope.

21 Claims, 6 Drawing Sheets

(51) Int. Cl.
  *G01S 7/484* (2006.01)
  *G01S 17/86* (2020.01)
  *G01S 17/95* (2006.01)
  *H01S 5/00* (2006.01)

(56) References Cited

U.S. PATENT DOCUMENTS

| | | | | |
|---|---|---|---|---|
| 8,345,250 | B1* | 1/2013 | Janosky | G01S 7/4817 |
| | | | | 250/338.5 |
| 9,097,646 | B1* | 8/2015 | Campbell | G01S 17/95 |
| 10,605,900 | B2* | 3/2020 | Spuler | G01S 17/95 |
| 11,143,748 | B2* | 10/2021 | Spuler | G01S 7/4814 |
| 11,243,295 | B2* | 2/2022 | Spuler | G01S 7/4814 |
| 2017/0139047 | A1 | 5/2017 | Abari et al. | |
| 2017/0212218 | A1 | 7/2017 | Spuler et al. | |
| 2017/0212219 | A1 | 7/2017 | Spuler et al. | |

OTHER PUBLICATIONS

Wandinger Ulla: "Raman Lidar techniques for the observation of atmospheric aerosols, temperature, and humidity", 13th International School on Quantum Electronics: Laser Physics and Applications, vol. 5830, Apr. 22, 2005 (Apr. 22, 2005), pp. 307-316, XP040205529, DOI: 10.1117/12.618855, figure 2.

Ansmann Albert: "Errors in ground-based water-vapor DIAL measurements due to Doppler-broadened Rayleigh backscattering", Applied Optics, vol. 24, issue 21, Nov. 1, 1985 (Nov. 1, 1985), pp. 3476-3480, DOI: 10.1364/AO.24.003476.

Bösenberg Jens: "Ground-based differential absorption lidar for water-vapor and temperature profiling: methodology", Applied Optics, vol. 37, issue 18, Jun. 20, 1998 (Jun. 20, 1998), pp. 3845-3860, DOI: 10.1364/AO.37.003845.

Hayman Matthew et al: "Demonstration of a diode-laser-based high spectral resolution lidar (HSRL) for quantitative profiling of clouds and aerosols", Optics Express, vol. 25, issue 24, Nov. 27, 2017 (Nov. 27, 2017), pp. A1096-A1110, DOI: 10.1364/OE.25.0A1096.

Klett James D: "Stable analytical inversion solution for processing lidar returns", Applied Optics, vol. 20, issue 2, Jan. 15, 1981 (Jan. 15, 1981), pp. 211-220, DOI: 10.1364/AO.20.000211.

Nehrir Amin R et al: "Eye-Safe Diode-Laser-Based Micropulse Differential Absorption Lidar (DIAL) for Water Vapor Profiling in the Lower Troposphere", American Meteorological Society, Journal of Atmospheric and Oceanic Technology, vol. 28, issue 2, Feb. 1, 2011 (Feb. 1, 2011), pp. 131-147, DOI: 10.1175/2010JTECHA1452. 1.

Repasky Kevin S et al: "Progress towards an Autonomous Field Deployable Diode-Laser-Based Differential Absorption Lidar (DIAL) for Profiling Water Vapor in the Lower Troposphere", Remote Sensing, vol. 5, issue 12, Nov. 25, 2013 (Nov. 25, 2013), pp. 6241-6259, ISSN 2072-4292, DOI: 10.3390/rs5126241.

Spuler SM et al: "Field-deployable diode-laser-based differential absorption lidar (DIAL) for profiling water vapor", Atmospheric Measurement Techniques, vol. 8, issue 3, Mar. 4, 2015 (Mar. 4, 2015), pp. 1073-1087, published by Copernicus Publications on behalf of the European Geosciences Union, DOI: 10.5194/amt-8-1073-2015.

Theopold Felix A Te Al: "Differential Absorption Lidar Measurements of Atmospheric Temperature Profiles: Theory and Experiment", American Meteorological Society, Journal of Atmospheric and Oceanic Technology, vol. 10, issue 2, Apr. 1, 1993 (Apr. 1, 1993), pp. 165-179, DOI: 10.1175/1520-0426(1993)010<0165:DALMOA>2.0.CO;2.

Weckwerth Tammy M et al: "Validation of a Water Vapor Micropulse Differential Absorption Lidar (DIAL)", American Meteorological Society, Journal of Atmospheric and Oceanic Technology, vol. 33, issue 11, Nov. 1, 2016 (Nov. 1, 2016), pp. 2352-2372, DOI: 10.1175/JTECH-D-16-0119.1.

* cited by examiner

DIFFERENTIAL ABSORPTION LIDAR FOR PROFILING TEMPERATURE

GOVERNMENT LICENSE RIGHTS

This invention was made with United States Government support under awards M0856145 awarded by the National Science Foundation. The Government has certain rights in this invention.

TECHNICAL FIELD

The present Application is directed towards LIDAR systems, and more particularly, to a micropulse differential absorption LIDAR system.

BACKGROUND

Light detection and ranging (LIDAR) instruments are frequently employed in the atmospheric sciences and are often used to detect elastic backscatter. A LIDAR works as follows: a laser source emits a pulse of light, and as the pulse propagates, the photons interact with particles in the atmosphere. Some of these interactions, such as Mie and Rayleigh scattering, result in backscattered photons. The photons are collected by the detector and recorded as function of time. The number of photons collected can be correlated with the backscatter efficiency and the time-of-flight data has a direct correspondence with the range (distance) at which the backscattering event occurred. The number of photons observed can further be correlated with the backscattering intensity.

Differential absorption LIDAR (DIAL) is based on the same principal, but operates at two wavelengths, one online, or on-resonance, and one offline, or off-resonance of an molecular species of interest. The difference between both signals has a direct functional relationship to the number density of the molecular species. Thus, the DIAL may provide the quantity of a molecular species in the atmosphere.

A DIAL may also be used to provide temperature profile information by observing a temperature-sensitive absorption line from a known concentration of molecular species. For example a temperature-sensitive oxygen ($O_2$) line may be observed in the atmosphere. In this way, it is possible to determine temperature data.

Prior methods of using a DIAL instrument to observe a temperature-sensitive $O_2$ line to obtain temperature data assumed a mixing ratio of oxygen $O_2$ in the atmosphere. While the mixing ratio of $O_2$ may be fairly stable in the atmosphere, it does change based on water vapor present in the environment. Wetter climates may therefore have a lower mixing ratio of oxygen because water is more abundant, and this introduces errors into the temperature measurements determined using the DIAL technique. Therefore, the water vapor must be measured independently to obtain an accurate measure of temperature.

The relative contributions of molecules and aerosols to the backscattered signal is required to correct for Doppler broadening of the molecular backscattered signal so that $O_2$ DIAL has suitable temperature retrieval accuracy. Previous attempts to perform this correction used a Klett or Fernald inversion. Such inversions effectively solve for two unknowns with one observation and therefore have high errors because they must assume a lidar ratio to convert extinction to backscattering. These errors are largest when aerosol/cloud scattering is small, precisely the point where Doppler error contributions in the DIAL are most significant. Thus the Klett or Fernald inversions fail to quantitatively measure the aerosol component, and this may introduce further errors into the temperature data. Without Doppler broadening correction, the $O_2$ DIAL data is not useful to understand atmospheric meteorological phenomena.

A straightforward, low-cost and quantitatively robust method for reducing $O_2$ DIAL-derived temperature errors due to Doppler broadening and water vapor mixing ratio is needed to enable $O_2$ DIAL temperature capability.

SUMMARY

A beam transmitter for a LIDAR is provided. The beam transmitter comprises a first transmission channel comprising a first online laser operable to produce a first online laser signal, a first offline laser operable to produce a first offline laser signal, a first laser transmission selection switch operable to toggle between including the first online laser signal and the first offline laser signal in a first transmission beam. The beam transmitter further comprises a second transmission channel comprising a second online laser operable to produce a second online laser signal, a second offline laser operable to produce a second offline laser signal, a second laser transmission selection switch operable to toggle between including the second offline laser signal or the second online laser signal in a second transmission beam. The beam transmitter further comprises at least one light redirection device operable to co-align the first transmission beam with the second transmission beam to generate a combined transmission beam.

A method according to a first aspect for transmitting a combined transmission beam for a LIDAR is provided. The method comprises generating a first transmission beam using a first transmission channel comprising: producing a first online laser signal using a first online laser, producing a first offline laser signal using a first offline laser, and toggling between including the first online laser signal and the first offline laser signal in the first transmission beam using a first laser transmission selection switch operable to toggle between including the first online laser signal and the first offline laser signal in the first transmission beam. The method further comprises generating a second transmission beam using a second transmission channel comprising: producing a second online laser signal using a second online laser, producing a second offline laser signal using a second offline laser, and toggling between including the second online laser signal and the second offline laser signal in the second transmission beam using a second laser transmission selection switch operable to toggle between including the second online laser signal and the second offline laser signal in the second transmission beam. The method further comprises co-aligning the first transmission beam and the second transmission beam using at least one light redirection device to create the combined transmission beam.

A receiver for a LIDAR is provided. The receiver comprises a first splitter for separating a first return signal component and a remainder return signal from a combined return signal, a first filter operable to generate a filtered first return signal component from the first return signal component, and a first detector channel operable to detect a first online return signal component and a first offline return signal component from the filtered first return signal component. The receiver further comprises a second splitter for separating a second return signal component and a third return signal component from the remainder return signal, a second filter operable to generate a filtered second return signal component from the second return signal component or the remainder return signal, and a second detector channel operable to detect a second online return signal component and a second offline return signal component from the filtered second return signal component.

A method according to a second aspect for receiving a combined signal for a LIDAR is provided. The method comprises separating a first return signal component and a remainder return signal from a combined return signal using a first splitter, filtering a filtered first return signal component from the first return signal component using a first filter, and detecting a first online return signal component and a first offline return signal component from the filtered return signal component using a first detector channel. The method further comprises separating a second return signal component and a third return signal component from the remainder return signal using a second splitter, filtering a filtered second return signal component from the second return signal component using a second filter, and detecting a second online return signal component and a second offline return signal component from the filtered second return signal component using a second detector channel.

ASPECTS

In a further aspect of the beam transmitter, at least one of the first online laser, the first offline laser, the second online laser, or the second offline laser may be a Distributed Bragg Reflector (DBR) or A Distributed Feedback (DFB) laser.

In a further aspect of the beam transmitter, the first online laser and the first offline laser of the first transmission channel, or the second online laser and the second offline laser of the second transmission channel may have a wavelength difference of 0.5 nanometers or less.

In a further aspect the beam transmitter may further comprise a third transmission channel comprising a fifth laser operable to produce a third laser transmission beam, and the light redirection device may be further operable to coalign the third laser transmission beam with the first transmission beam and the second transmission beam.

In a further aspect of the beam transmitter, at least one of first transmission channel or the second transmission channel may further comprise an isolator which receives a portion of a transmission beam to generate an isolated beam, and an amplifier which receives at least a portion of the isolated beam.

In a further aspect of the method according to the first aspect, at least one of the first online laser, the first offline laser, the second online laser, or the second offline laser may be a Distributed Bragg Reflector (DBR) or A Distributed Feedback (DFB) laser.

In a further aspect of the method according to the first aspect, the first online laser and the first offline laser of the first transmission channel, or the second online laser and the second offline laser of the second transmission channel may have a wavelength difference of 0.5 nanometers or less.

In a further aspect of the method according to the first aspect, the method may further comprise generating a third transmission beam using a third transmission channel comprising a fifth laser, wherein generating the combined transmission beam further comprises coaligning the third transmission beam with the first transmission beam and the second transmission beam using the at least one light redirection device.

In a further aspect, the receiver may further comprise a third filter operable to generate a filtered third return signal component from the third return signal component, a third splitter for separating a first portion of the third return signal component and a second portion of the third return signal component from the filtered third return signal component. The receiver may further comprise a rubidium cell for filtering the first portion of the third return signal component to generate a rubidium filtered third return signal component, a third detector channel operable to detect the rubidium filtered third return signal component, and a fourth detector channel operable to detect the second portion of the third return signal component.

In a further aspect, the receiver may further comprise a potassium cell for filtering the third return signal component to generate a potassium filtered third return signal component, and a third detector channel operable to detect the potassium filtered third return signal component.

In a further aspect of the receiver, at least one of the first filter or the second filter may further comprise a first narrow band filter, an etalon, and a second narrow band filter.

In a further aspect of the receiver, the third filter may further comprise a narrow band filter, a first etalon, and a second etalon.

In a further aspect of the receiver, at least one of the first detector or the second detector may further comprise a single photon module counting module.

In a further aspect, the receiver may further comprise a multi-channel scalar for receiving at least a signal from the first detector or the second detector.

In a further aspect, the method according to the second aspect may further comprise filtering a filtered third return signal component from the third return signal component using a third filter, splitting a first portion of the third return signal component and a second portion of the third return signal component from the filtered third return signal component using a third splitter, filtering the first portion of the third return signal component to generate a rubidium filtered third return signal component using a rubidium cell, detecting the rubidium filtered third return signal component using a third detector channel, and detecting the second portion of the third return signal component using a fourth detector channel.

In a further aspect, the method according to the second aspect may further comprise splitting a first portion of the third return signal component and a second portion of the third return signal component from the third return signal component using a third splitter, filtering the first portion of the third return signal component to generate a potassium filtered third return signal component using a potassium cell, and detecting the potassium filtered third return signal component using a third detector channel.

In a further aspect of the method according to the second aspect, at least one of the first filter or the second filter may further comprise a first narrow band filter, an etalon, and a second narrow band filter.

In a further aspect of the method according to the second aspect, the third filter may further comprise a narrow band filter, a first etalon, and a second etalon.

In a further aspect of the method according to the second aspect, at least one of the first detector or the second detector may further comprise a single photon module counting module.

In a further aspect, the method according to the second aspect may further comprise a multi-channel scalar for receiving at least a signal from the first detector or the second detector.

In a further aspect, a LIDAR may be provided comprising the beam transmitter, the receiver, and a shared telescope comprising an inner portion through which the first transmission beam and the second transmission beam are transmitted, and an outer portion configured to receive reflected laser light.

In a further aspect, a method for operating a LIDAR may be provided, the method comprising transmitting a combined transmission beam according to the method of the first aspect, receiving a combined signal according to the method of the second aspect, wherein the combined transmission beam may be transmitted through, and the combined signal may be received via a shared telescope comprising an inner portion through which the first transmission beam and the second transmission beam are transmitted, and an outer portion configured to receive the combined return signal.

BRIEF DESCRIPTION OF THE DRAWINGS

The same reference number represents the same element on all drawings. The drawings are not necessarily to scale.

DETAILED DESCRIPTION

FIGS. 1-6 and the following description depict specific examples to teach those skilled in the art how to make and use the best mode of the Application. For the purpose of teaching inventive principles, some conventional aspects have been simplified or omitted. Those skilled in the art will appreciate variations from these examples that fall within the scope of the Application. Those skilled in the art will appreciate that the features described below may be combined in various ways to form multiple variations of the Application. As a result, the Application is not limited to the specific examples described below, but only by the claims and their equivalents.

Figure 1:
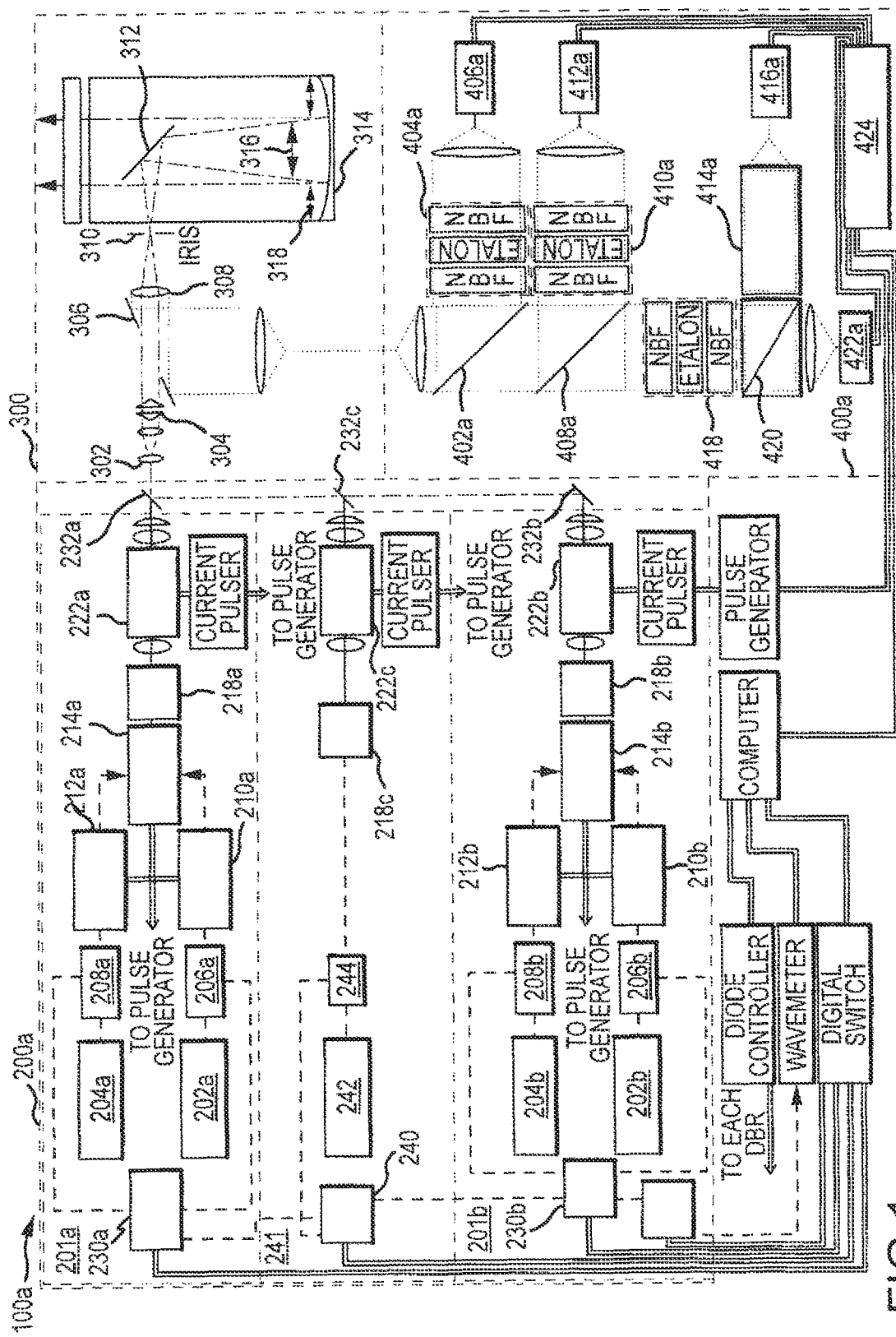
FIG. 1 depicts micropulse differential absorption LIDAR 100a, in accordance with an embodiment.
Figure 2:
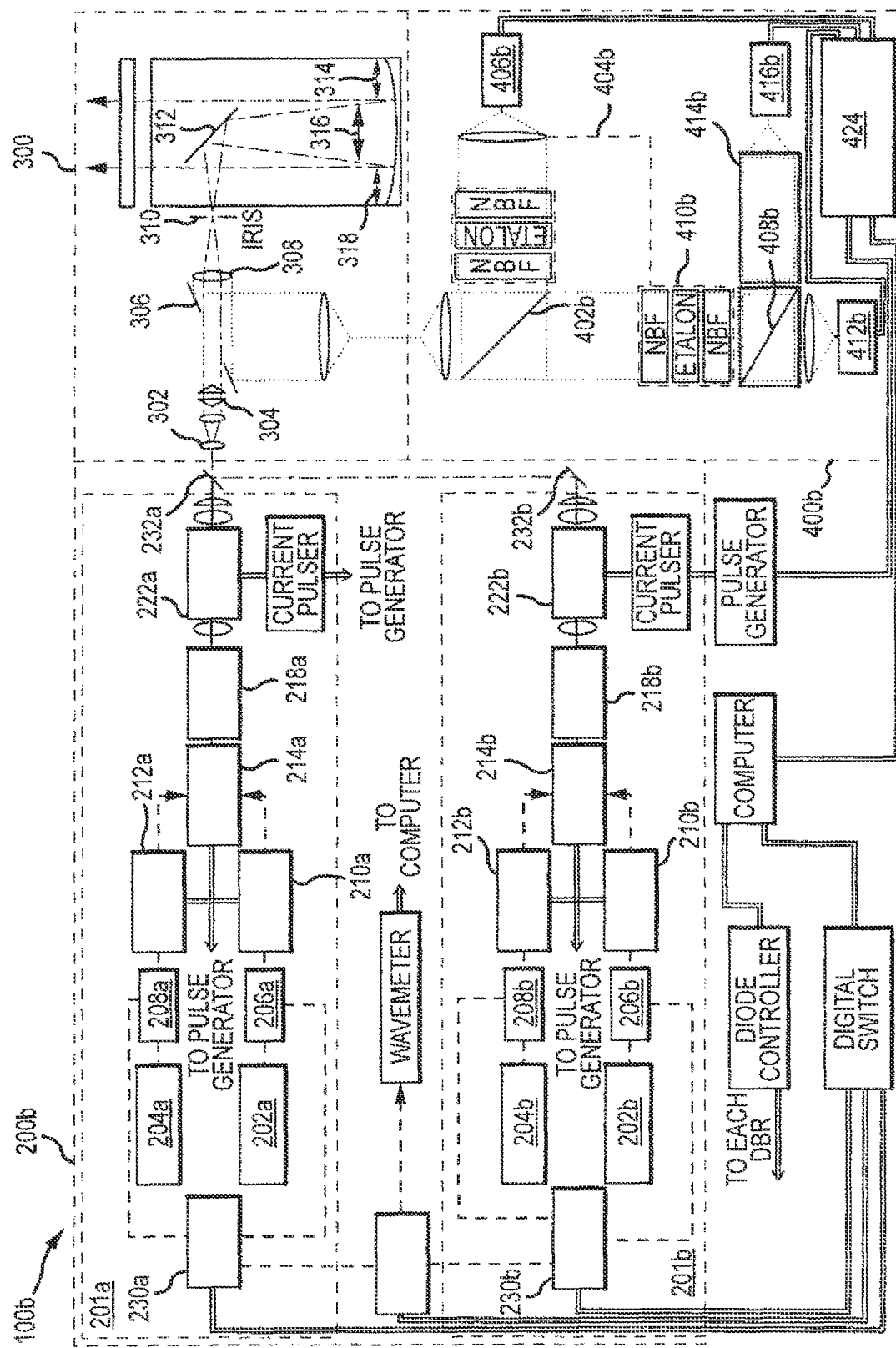
FIG. 2 depicts micropulse differential absorption LIDAR 100b, in accordance with an embodiment.

FIG. 1 depicts micropulse differential absorption LIDAR 100a, which comprises a beam transmitter 200a, a shared optics and telescope 300, an optical receiver 400a. FIG. 2 depicts micropulse differential absorption LIDAR 100b, which comprises a beam transmitter 200b, shared optics and telescope 300, an optical receiver 400b. In embodiments, LIDARs 100a and 100b may be used to detect water vapor, oxygen $O_2$, or any other molecular species, in addition to aerosols and molecular background scattering, as will be further described below.

Beam Transmitter

LIDAR 100a includes beam transmitter 200a, and LIDAR 100b includes beam transmitter 200b. Each of beam transmitters 200a and 200b include a first transmission channel 201a and a second transmitter channel 201b.

First transmitter channel 201a includes: an online laser 202a, an offline laser 204a, and a laser transmission selection switch 214a. First transmission channel 201a may further include splitters 206a and 208a, switches 210a and 212a, an isolator 218a, and an amplifier 222a.

Second transmitter channel 201b of LIDAR 100a is similar to first beam transmitter channel 201a in the composition and layout. Second transmitter channel 201b includes: an online laser 202b, an offline laser 204b, and a laser transmission selection switch 214b. Second transmission channel 201b may further include splitters 206b, and 208b, switches 210b, 212b, an isolator 218b, and an amplifier 222b.

In embodiments, each of first transmitter channel 201a and second transmitter channel 201b may be operable to observe a separate molecular species. Each transmitter channel may include an online laser 202a, 202b and an offline laser 204a, 204b operable to generate a respective transmission beam. In embodiments, the online laser 202a, 202b frequency may be selected to produce an on-resonance absorption response, and offline laser 204a, 204b may be selected to produce an off-resonance absorption response for a molecular species of interest.

Because the operation of the first and second transmission channels 201a, 201b is similar, the following description discusses them together, providing relevant reference numerals for both channels.

In embodiments, each pair of online laser 202a, 202b and offline laser 204a, 204b may operate in continuous wave mode, producing up to 80 mW of power with a measured line width less than 1 MHz. In embodiments, any combination of online lasers 202a, 202b and offline laser 204a, 204b may be distributed Bragg reflector (DBR) laser or Distributed Feedback (DFB) laser diodes. Advantageously, using a laser diode e.g., DBR laser or DFB laser may provide a more affordable DIAL instrument while enabling a narrow line width source.

In embodiments, laser transmission selection switch 214a, 214b may be used to toggle, or alternate including signal from online laser 202a, 202b and offline laser 204a, 204b in a single transmission channel beam at high repetition rates. In embodiments, first and second beam transmitters 201a, 201b may be operated with the online and offline wavelengths interleaved at a rate of 100 Hz, although other rates may also be used. In embodiments, laser transmission selection switch 214a, 214b may comprise a fast-electro-optic switch with 200 ns switching speed driver boards.

Beam transmitters 200a, 200b further comprise at least one light redirection device 232a, 232b operable to coalign the first transmission beam from first transmission channel 201a with the second transmission beam from second transmission channel 201b. The coaligned first and second transmission beams may then exit beam transmitter 200a, 200b to enter shared optics and telescope 300.

In the embodiments depicted by FIGS. 1 and 2, light redirection device 232a is a beam splitter operable to reflect light from second transmission channel 201b towards shared telescope 300, while allowing light from the first transmission channel 201a to pass through. Light redirection device 232a may be a dichroic beam splitter, or any other type of beam splitter known to those of skill. In the embodiments depicted, light redirection device 232b is a reflector operable to reflect the light from second transmission channel 201b towards light redirection device 232a. Further embodiments of light redirection devices 232a, 232b are possible to accommodate further arrangements of first and second transmission channels 201a, 201b, however, as will be understood by those of skill.

In embodiments, first and second transmission channels 201a, 201b may comprise further elements. For example, first and second transmission channels 201a, 201b may comprise splitters 206a, 206b, 208a, 208b and further switches 210a, 210b, 212a, 212b, 230a, 230b. In embodiments, the output from online laser 202a, 202b may be transmitted into splitter 206a, 206b, and the output of offline laser 204a, 204b may also be transmitted into splitter 208a, 208b. Splitter 206a, 206b may be operable to divide a transmission beam output from online laser 202a, 202b between switch 230a, 230b and a first switch 210a, 210b, and splitter 208a, 208b may be operable to divide a transmission beam output from offline laser 204a, 204b between switch 230a, 230b and switch 212a, 212b. Switch 230a, 230b may be operable to enable monitoring of the stability of online laser 202a, 202b or offline laser 204a, 204b via a wavelength reference, such as, for example, a wavelength meter.

In embodiments, first and second transmission channels 201a, 201b may further include a first switch 210a, 210b and a second switch 212a, 212b. Switches 210a, 210b, 212a, 212b may be 1×1 switches that are toggled off and on to modulate the respective online laser 202a, 202b and offline laser 204a, 204b pulse signals, respectively. The transmission beam produced by each of first transmission channel 201a and second transmission channel 201b may next passes from switch 210a, 210b and switch 212a, 212b onto laser transmission selection switch 214a, 214b.

In embodiments, laser transmission selection switch 214a, 214b may be electronically controllable to transmit the transmission beam alternatingly from first switch 210a, 210b for online laser 202a, or second switch 212a, 212b for offline laser 204a, 204b. In embodiments, switches 210a, 210b, 212a, 212b, 230a, and 230b may be fast electro-optic switches.

After a transmission beam emerges from laser transmission selection switch 214a, 214b, the transmission beam may next pass into isolator 218a, 218b. The isolated transmission beam may next pass through amplifier 222a, 222b.

In embodiments, laser transmission selection switch 214a, 214b may be used to seed pulse signals to an amplifier 222a, 222b at high repetition rates. In embodiments, amplifier 222a, 222b may be a tapered semiconductor optical amplifier (TSOA). For example, amplifier 222a, 222b may be a 4 mm long TSOA used to amplify and pulse the beam transmitter. When combined with amplifier 222a, 222b, the beam from online laser 202a, 202b and offline laser 204a, 204b alternatively included may produce a first or second channel transmission beam operable to make differential absorption LIDAR measurements.

In embodiments, amplifier 222a, 222b may be driven with a current pulser. In embodiments, a pulse generator may be used as a master clock for LIDAR 100a, 100b. For example, the leading edge of the pulse generator may also be used to trigger switches 210a, 210b, 212a, 212b, and first and second laser transmission selection switches 214a, 214b directly or via a digital IO board.

In the embodiment with amplifier 222a, 222b being a TSOA, the astigmatic geometry of the output facet of the TSOA may further include shaping the transmission beam with a beam shaping pair of lenses to achieve a nominally circular collimated beam. For example, the beam shaping pair of lenses may include a spherical lens and a cylindrical lens.

Although first transmission channel 201a and second transmission channel 201b are discussed together above, those of skill will readily understand that first transmission channel 201a and second transmission channel 201b may also comprise different components or different configurations.

In embodiments, second transmission channel 201b may be used to determine temperature in the atmosphere by observing oxygen ($O_2$) absorption lines. By using online laser 202b to observe a temperature-sensitive $O_2$ absorption line, and offline laser 204b to observe away from an $O_2$ absorption line, it may be possible to estimate a temperature using second transmission channel 201b.

In embodiments, first transmission channel 201a may be used to determine the water vapor content in the atmosphere. The water vapor content may further allow for the determination of the mixing ratio of $O_2$ in the atmosphere. By using online laser 202a to observe a water vapor-sensitive line, and offline laser 204a to observe away from a water-vapor absorption line, it may be possible to correct the temperature determined using the second transmission channel 201b based on the mixing ratio of water vapor in the atmosphere. In embodiments, the water vapor sensitive lines chosen for first transmission channel 201a may be temperature-insensitive to isolate changes in the absorption cross section of the water vapor lines to mixing ratio.

Figure 3:
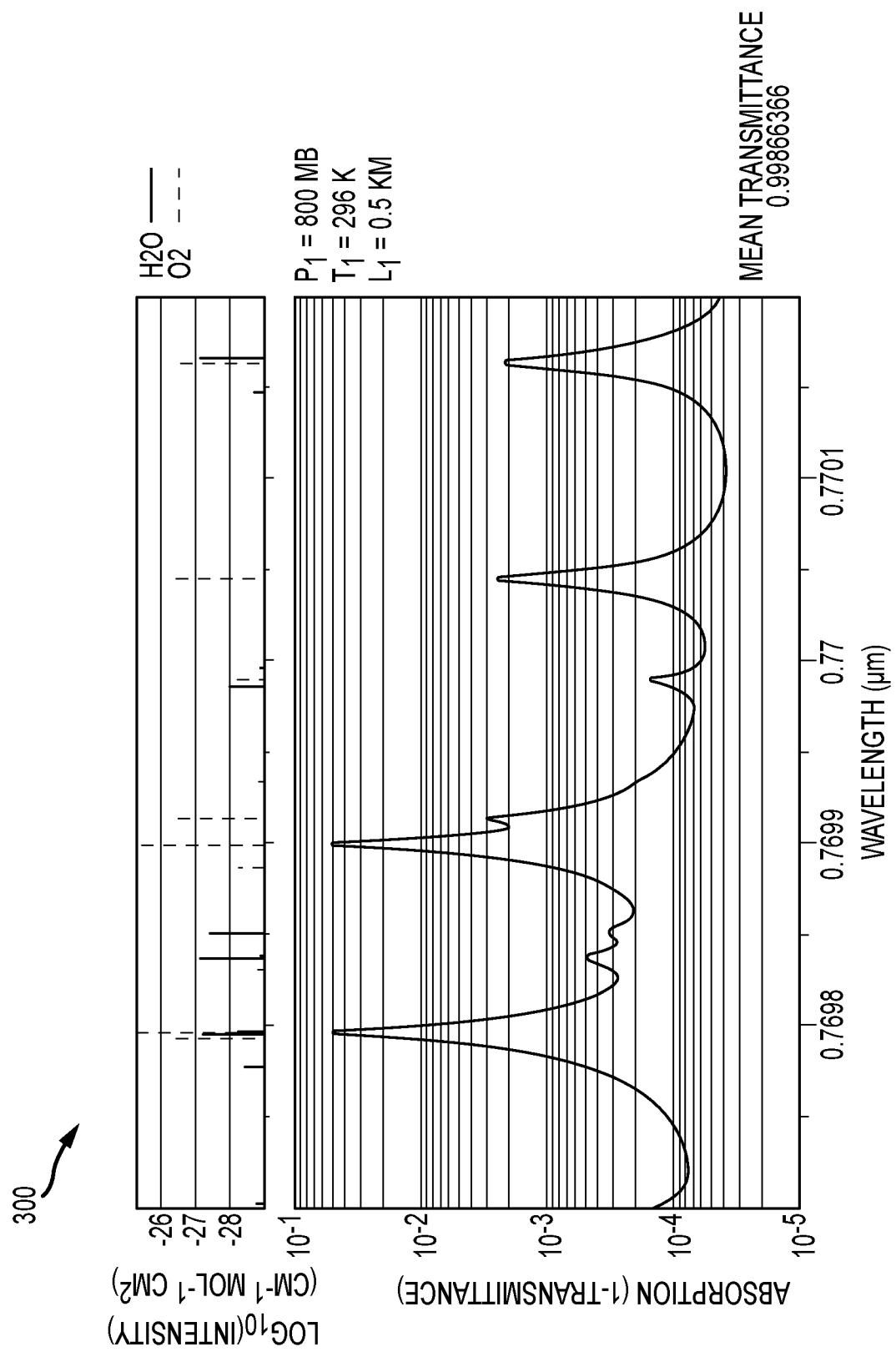
FIG. 3 depicts absorption spectrum 300, in accordance with an embodiment.

FIG. 3 depicts example absorption spectrum 300. Absorption spectrum 300 comprises the absorption of the atmosphere due to $O_2$ and water vapor near the oxygen A-band. Absorption spectrum 300 depicts a model of the absorption for a ½ km transmission beam at a pressure of 800 mb and a temperature of 296 K.

The lines in absorption spectrum 300 are temperature sensitive through their ground state energy. By selecting $O_2$ lines for the second transmission channel 201b with higher ground state energy than that of the water vapor lines selected for the first transmission channel 201a, it may be possible to obtain a more accurate temperature measurement. For example, absorption spectrum 300 includes a temperature-sensitive $O_2$ line at 769.7958 nm that may be selected for online laser 202b.

In embodiments, the wavelength of online laser 202b may correspond to an absorption line in the oxygen A band while the wavelength of offline laser 204b may be selected to minimize atmospheric absorption to the extent possible. By providing two transmission channels 201a and 201b in a single LIDAR 100a, 100b, using shared optics and telescope 300 and a single optical receiver 400a, 400b, it may be possible to provide a more accurate, temperature measurement calibrated for the $O_2$ mixing ratio in the environment.

In embodiments, a wavelength for offline laser 204a, 204b may be selected based on its proximity to a suitable online laser 202a, 202b wavelength. For example, the online laser 202a and the offline laser 204a of the first transmission channel 201a, or the online laser 202b and the offline laser 204b of the second transmission channel 201b may have a wavelength difference of a few tenths of nanometers. In embodiments, the online laser 202a and the offline laser 204a of the first transmission channel 201a, or the online laser 202b and the offline laser 204b of the second transmission channel 201b may have a wavelength difference of 0.5 nanometers or less. In further embodiments, the online laser 202a and the offline laser 204a of the first transmission channel 201a, or the online laser 202b and the offline laser 204b of the second transmission channel 201b may have a wavelength difference of 0.3 nanometers or less.

In embodiments, beam transmitter 200a of LIDAR 100a may further comprise a third transmission channel 241. In examples, third transmission channel 241 may operate as a high spectral resolution LIDAR (HSRL) operable to determine a backscatter ratio.

Third transmission channel 241 may comprise a fifth laser 242 operable to produce a third laser transmission beam. In embodiments, the fifth laser may be selected to correspond to any well-behaved absorption spectrum with suitable width and absorption strength. Rubidium's D2 line is an accepted reference.

In embodiments, fifth laser 242 may comprise a distributed Bragg reflector 780.246 nm laser which provides a source with power and frequency stability needed for accurate filtering of molecular and aerosol backscatter in an DLB HSRL receiver. When paired with a rubidium cell, fifth laser 242 may allow for the separation of cloud and aerosol signal from backscatter signal, as will be further described below with regards to the optical receiver.

In embodiments, beam transmitter 100a may provide a combined transmission beam as summarized in Table I.

TABLE I

| Laser | Species | Wavelength |
| --- | --- | --- |
| Online laser 202a | Water vapor | 828.19 nm |
| Offline laser 204a | Water vapor | 828.29 nm |
| Online laser 202b | O2 | 769.7958 nm |
| Offline laser 204b | O2 | 770.1085 nm |
| HSRL laser | backscatter | 780 nm |

In embodiments, third transmission channel 241 may further comprise a splitter 244, operable to divide the third laser transmission beam between a wavelength reference for monitoring, and a telescope for transmission. In embodiments, splitter 244 may divide the third laser transmission beam between switch 240, operable to provide signal to the wavelength reference, and isolator 218c.

After passing through isolator 218c, the third transmission beam may be further amplified via amplifier 222c. In embodiments, a current pulser may be used to seed amplifier 222c, similar to amplifiers 222a, 222b. In embodiments, amplifier 222c may also be a TSOA.

In the embodiment with amplifier 222c being a TSOA, third transmission channel 241 may further include a beam shaping pair of lenses to achieve a nominally circular collimated beam, such as a shaping pair of lenses may include a spherical lens and a cylindrical lens.

Third transmission channel 241 may further comprise a light redirection device 232c. Light redirection device 232c may be further operable to coalign the third laser transmission beam with the first transmission beam and the second transmission beam. For example, light redirection device 232c may comprise a dichromatic beam splitter operable to reflect light from third transmission channel 242 towards shared telescope 300, while allowing light from the second transmission channel 201b to pass through. As those of skill will readily understand, however, other optical layouts for LIDAR 100a are possible, along with other embodiments of light redirection device 232c.

The embodiment LIDAR 100b does not include a third transmission channel, as may be seen in FIG. 2. In embodiments, the wavelength of offline laser 204b may be selected to provide both an offline molecular species signal, and HSRL signal operable to determine a backscatter ratio. For example, beam transmitter 200b may utilize the example wavelengths provided in Table II below.

TABLE II

| Laser | Species | Wavelength |
| --- | --- | --- |
| Online laser 202a | Water vapor | ~828.19 nm |
| Offline laser 204a | Water vapor | ~828.29 nm |

TABLE II-continued

| Laser | Species | Wavelength |
| --- | --- | --- |
| Online laser 202b | O2 | 769.7958 nm |
| Offline laser 204b | O2 and HSRL | 770.1085 nm |

In examples, using offline laser 204b to provide a HSRL channel may further comprise using a potassium cell in optical receiver 400b, to allow for the separation of cloud and aerosol signal from backscatter signal, as will be further described below.

Advantageously, by using offline laser 204b to provide a HSRL signal, LIDAR 100b may provide a beam transmitter 200b capable of providing accurate temperature retrievals with one less laser, switch, amplifier, isolator, and light redirection device. This may allow for a lower cost, simpler temperature measurement system.

Shared Optics and Telescope

Each embodiment of LIDAR 100a, 100b may further include a shared optics and telescope 300. Shared optics and telescope 300 includes an inner portion 316 through which the combined transmission beam is transmitted, and an outer portion 318 configured to receive a combined return signal. In embodiments, shared optics and telescope 300 may include a beam expander 302, axicon lenses 304, a mirror with bore hole 306, a telescope lens 308, an iris 310, a primary mirror 312, a secondary mirror 314, an inner mirror portion 316, and an outer mirror portion 318.

Shared optics and telescope 300 is operable to transmit the combined transmission beam received from beam transmitter 200a, 200b. Shared optics and telescope 300 is also operable to receive a combined return signal. In embodiments, shared optics and telescope 300 may be a Newtonian telescope f/3 design.

In embodiments, the combined transmission beam may first enter beam expander 302. Beam expander 302 is operable to expand the collimated signal received from beam transmitter 200a, 200b. In embodiments, beam expander 302 expands the diameter of the transmission beam 2 times.

The combined transmission beam may next be incident on axicon lenses 304. Axicon lenses 304 may be a matched pair of axicon, or conical lenses that shape the transmission beam into an annular transmission beam. The annular beam shaped by axicon lenses 304 may include an outside diameter and an inside diameter. In embodiments, the outside beam diameter of the annular transmission beam may be determined by the axicon spacing and wedge angle while the inside beam diameter may be determined by the incident beam diameter. Advantageously, beam expander 302 and axicon lenses 304 may shape the annular transmission beam efficiently for transmission through the telescope.

After the combined transmission beam emerges from axicon lenses 304 as an annular transmission beam, it may next pass through the center bore of a mirror with bore hole 306. The collimated, annular transmission beam may next fall incident on telescope lens 308, which may focus the annular transmission beam. The transmitted beam may next pass through iris 310 and onto secondary mirror 312. Secondary mirror 312 may deflect the focused annular transmission beam towards primary mirror 314 to generate a deflected annular transmission beam.

In embodiments, primary mirror 314 may include circular inner mirror portion 316 and annular outer mirror portion 318. Circular inner mirror portion 316 receives and then expands the deflected annular transmission beam. The deflected annular transmission beam is then expanded by telescope lens 308 and collimated with the inner mirror portion 316 of the primary mirror 314, generating a transmitted beam with an outer beam diameter and an inner beam diameter. Advantageously, the width of the inner beam diameter may allow the annular-shaped transmission beam to clear the secondary mirror as it exits the telescope, minimizing losses in the transmitter beam pulse energy.

Advantageously, shared optics and telescope 300 may provide a combined transmission beam that is more optomechanically stable because the transmission beam is expanded by the telescope after the transmit mirror. The combined transmitted beam may further be eye safe per American National Standards Institute (ANSI) regulation.

A return signal including light scattered in the atmosphere is collected by the shared optics and telescope 300. Outer mirror portion 318 of primary mirror 314 collects the scattered return signal. In an example embodiment, outer mirror portion 318 may be an annulus with an inner diameter of 406 mm, an outer diameter of 528 mm.

After being deflected at secondary mirror 312 and passing through iris 310, combined return signal may be collimated by telescope lens 308. The return signal may fall incident on, and be deflected by a mirror portion of mirror with bore hole 306. Mirror with bore hole 306 may only collects light from outside an outer diameter received at primary mirror 314, providing improved signal isolation from the combined transmitted beam.

Optical Receiver

LIDARs 100a and 100b further include an optical receiver. For example, FIG. 1 depicts optical receiver 400a, and FIG. 2 depicts optical receiver 400b, in accordance with two embodiments. Optical receivers 400a and 400b include a first splitter 402a, 402b, a first filter 404a, 404b, a first detector channel 406a, 406b, a second splitter 408a, 408b, a second filter 410a, 410b, and a second detector channel 412a, 412b.

First splitter 402a, 402b is operable to separate a first return signal component and a remainder return signal from a combined return signal. In examples, first splitter 402a, 402b may comprise a dichroic beam splitter.

The combined return signal component may comprise the returned signal received from the shared telescope 300. Combined return signal 300 may include returned signal corresponding to beam transmitter 100a or 100b. In embodiments, the first return signal component may correspond to a returned signal from first transmission channel 201a, and the remainder return signal may correspond to returned signal from second transmission channel 201b. In further examples, remainder return signal may further correspond to returned signal from third transmission channel 241.

First filter 404a, 404b is operable to generate a filtered first return signal component from the first return signal component. First filter 404a, 404b may provide background noise suppression and constant transmission of the first laser wavelength and the second laser wavelength over a predetermined range of wavelengths.

In embodiments, first filter 404a, 404b may comprise a first narrow band filter, an etalon, and a second narrow band filter. In embodiments, both first and second narrow band filters may be filters with FWHM of approximately 0.5 nm with out of band blocking on the order of $10^6$. They may be identical.

In embodiments, the etalon may comprise a Fabry-Perot interferometer, operable to isolate or filter the two wavelengths of light representing adjacent interferometer cavity modes, the online and offline wavelengths, from the return signal. The etalon may be designed with a free spectral range that allows two narrow spectral lines to pass. The spectral location of the cavity modes may be adjusted by controlling the temperature of the etalon in a way that maintains the fixed FSR spacing between the cavity modes. Therefore, in embodiments, etalon may be housed in or coupled to a temperature controller (not pictured).

In embodiments, the etalon may include a finesse selected to provide substantial background noise suppression and substantially constant transmission of an online laser wavelength and an offline laser wavelength over the predetermined range of wavelengths. For example, a finesse of 40-50 may be large enough to reduce background noise, and small enough to maintain a substantially constant transmission of the predetermined range of wavelengths, regardless of laser and etalon fluctuations.

After exiting the etalon, the return signal enters a further narrow bandpass filter selected to include the online wavelength and the offline wavelength. For example, the narrow bandpass filter may be selected such that the transmission between the online laser 202a, 202b wavelength and the offline laser 204a, 204b wavelength are maximized. The narrow bandpass filter may be further selected so that the transmission outside a wavelength range between the online laser 202a, 202b wavelength and the offline 204a, 204b laser wavelength exponentially drops to zero.

Optical receiver 400a, 400b further comprises first detector channel 406a, 406b. First detector channel 406a, 406b is operable to detect a first online return signal component and a first offline return signal component from the filtered first return signal component received from first filter 404a, 404b. In embodiments, the first online return signal component may correspond to online laser 202a, and the first offline return signal component may correspond to offline laser 204a.

In examples, first detector channel 406a, 406b may comprise a single photon counting module (SPCM). In examples, first detector channel 406a, 406b may further comprise electronics to count photons from the alternating pulses of the first online return signal component and the first offline return signal component using signal from a pulse generator central to the timing of LIDAR 100a, 100b.

Optical receiver 400a, 400b further comprises a second splitter 408a, 408b for separating a second return signal component and a third return signal component from the remainder return signal. In embodiments, second splitter 408a, 408b may also comprise a dichroic beam splitter.

In embodiments, the second and third return signal components may correspond to returned signal from second transmission channel 201b. In further embodiments, however, the second return signal component may correspond to returned signal from second transmission channel 201b, and the third return signal component may further correspond to returned signal from third transmission channel 241.

Optical receiver 400a, 400b further comprises a second filter 410a, 410b operable to generate a filtered second return signal component from the second return signal component or the remainder return signal. In the embodiment of FIG. 1, optical receiver 400a comprises a second filter 410a operable to generate the filtered second return signal component from the second return signal component. In the embodiment of FIG. 2, however, optical receiver 400b comprises a second filter 410b operable to generate the filtered second return signal component from the remainder return signal.

In embodiments, second filter 410a, 410b may further comprise a first narrow band filter, an etalon, and a second narrow band filter, similar to first filter 404a, 404b. Second filter 410a, 410b, however, may be further selected and/or tuned to capture the second transmission beam provided by second transmission channel 201b, however.

Optical receiver 400a, 400b further comprises a second detector channel 412a, 412b operable to detect a second online return signal component and a second offline return signal component from the filtered second return signal component. Second detector channel 412a, 412b may be operable to detect an online return signal component and an offline return signal component from the filtered second return signal component. In embodiments, the second online return signal component may correspond to online laser 202b, and the offline return signal component may correspond to offline laser 204b.

Like first detector channel 406a, 406b, second detector channel 412a, 412b may also comprise a SPCM and electronics to support counting photons from the alternating pulses of the first online return signal component and the first offline return signal component.

Optical receivers 400a, 400b are operable to receive returned signal from the first and second transmission channels 200a, 200b. Advantageously, this may allow for a temperature determination using LIDAR 100a, 100b that is calibrated for the mixing ratio of oxygen in the atmosphere.

In further embodiments, however, optical receivers 400a, 400b may include further features. For example, optical receiver 400a of FIG. 1 may further comprise: a third filter 418, a third splitter 420a, a rubidium cell 414a, a third detector channel 416a, and a fourth detector channel 422a.

The third filter 418 provided by optical receiver 400a may be operable to generate a filtered third return signal component from the third return signal component. In examples, the third return signal component may correspond to returned signal from third transmission channel 241.

In embodiments, third filter 418 may further comprise a narrow band filter, a first etalon, and a second narrow band filter. In embodiments, a first narrow band filter may be a 10 nm bandpass filter, the second narrow band filter may be a 1 nm bandpass filter. Both first and second narrow band filters may include out of band blocking of $10^4$. In embodiments, the etalon may be specifically made to have a FSR of 158 GHz with out of band blocking on the order of $10^3$. In embodiments, the second narrow band filter may comprise an etalon.

The third splitter 420 provided by optical receiver 400a may be operable to separate a first portion of the third return signal component and a second portion of the third return signal component from the filtered third return signal component. In examples, the first portion of the third return signal component and the second portion of the third return signal component may correspond to returned signal from the third transmission beam provide by the third transmission channel. In examples, third splitter 420 may comprise a dichroic beam splitter.

The rubidium cell 414a provided by optical receiver 400a may be operable to filter the first portion of the third return signal component to generate a rubidium filtered third return signal component. To perform the HSRL technique, rubidium cell 414a may comprise an isotropic Rb 87, heated to approximately 320 K, the temperature at which the optical depth is sufficient to block strong backscatter from liquid water clouds. Optical depth is a measure of how much light is transmitted through a medium or device. It is the natural logarithm of the ratio of initial to the transmitted optical power and describes the ability of the medium or device to extinguish incident light.

When fifth laser 242 operates at 780.246 nm, the D2 line of rubidium is strongly absorbing. The wavelength of 780.246 nm further overlaps with a well-developed line of necessary commercial components such as the DBR lasers, TSOA and silicon-based SPCM detectors. These components are available as fiber coupled devices, an essential ingredient to maintain instrument alignment in an unattended network deployment. Thus, the rubidium filter in optical receiver 400a, when coupled with a fiber-coupled diode-laser-based transmitter, enables a low cost and low-maintenance HSRL technique capable of providing quantitative LIDAR data products.

In embodiments, rubidium cell 414a may be altered via a magnet-inducing hyperfine splitting based on the Zeeman effect. This may allow for the calibration of the HSRL channel without altering any of the optical layout.

Optical receiver 400a may further comprise a third detector channel 416a to detect the rubidium filtered third return signal component, and a fourth detector channel 422 operable to detect the second portion of the third return signal component. Third and fourth detector channels 416a and 422a may comprise SPCMs. Third detector channel 416a may correspond to backscatter signal filtered for clouds and aerosols, and fourth detector channel 422a may correspond to backscatter signal including clouds and aerosols. Between the third and fourth detector channel 416a and 422a counts, it may be possible to determine the backscatter ratio for the temperature data. This may allow for a more accurate temperature determination.

In embodiments, optical receiver 400b of LIDAR 100b may comprise further components. For example, optical receiver 400b may further comprise: a potassium cell 414b, and a third detector channel 416b.

Figure 4:
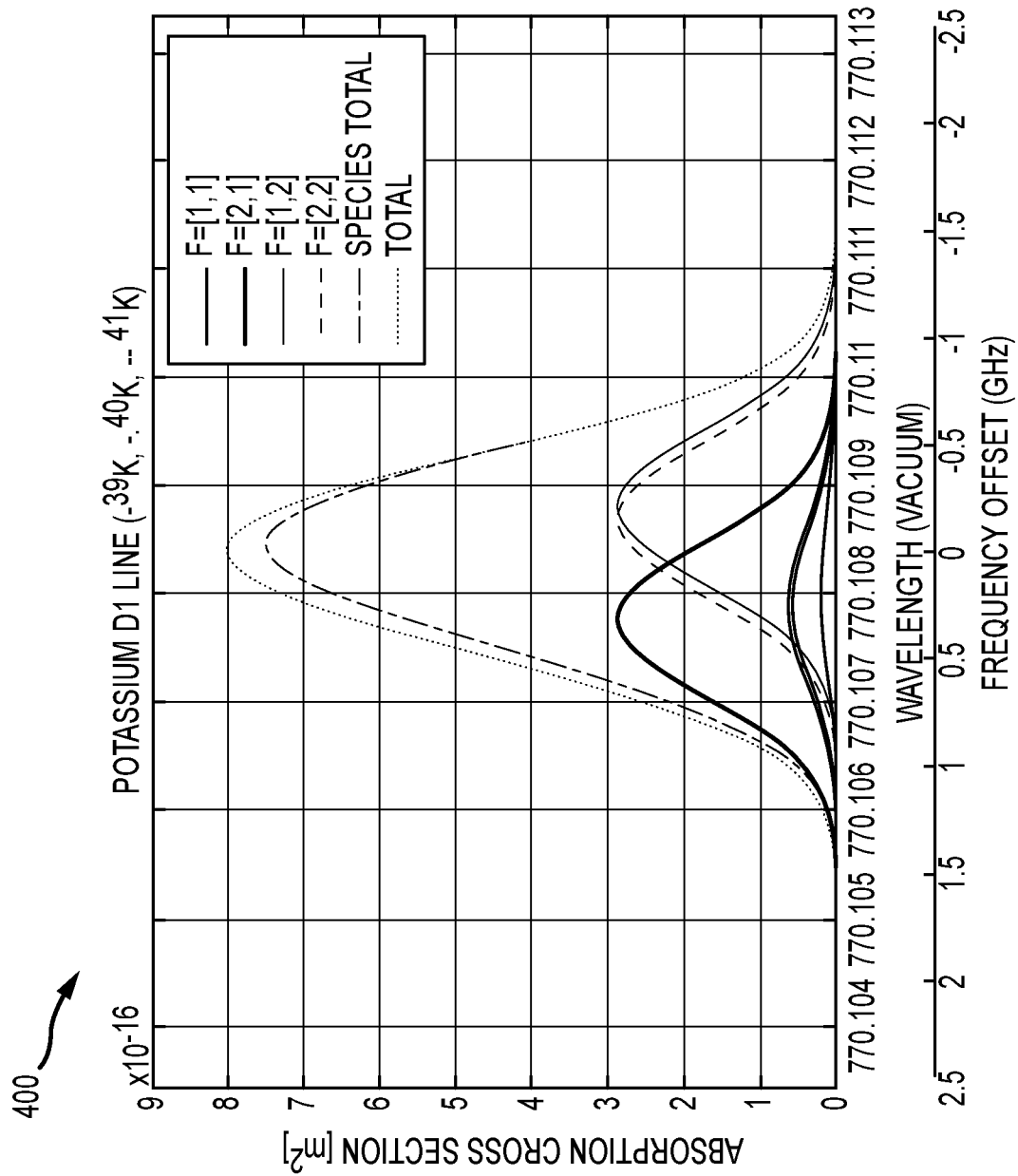
FIG. 4 depicts absorption cross section 400, in accordance with an embodiment.
Figure 5:
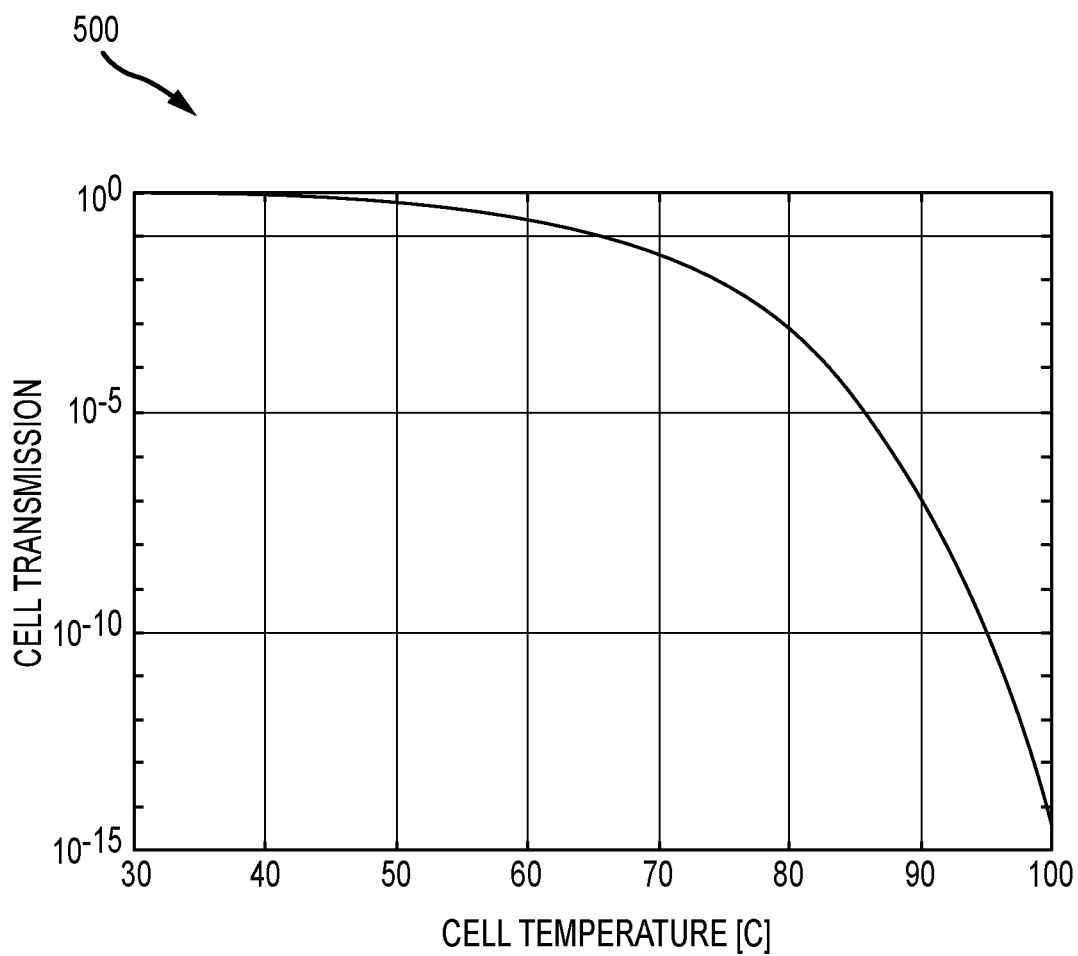
FIG. 5 depicts potassium cell transmission spectrum 500, in accordance with an embodiment.

The potassium cell 414b provided by optical receiver 400b may be operable to filter the third return signal component to generate a potassium filtered third return signal component. The potassium D1 line may act as a HSRL blocking filter, similar to the rubidium D2 line, although with some notable differences. FIG. 4 depicts potassium absorption cross section 400 for a natural abundance potassium cell with $^{39}K$, $^{40}K$, and $^{41}K$. As may be seen, the full width at half maximum is approximately 1 GHz.

At room temperature, potassium cell 414b is mostly solid with a small amount of vapor. Heating the potassium cell 414b increases the vapor pressure. The absorption of potassium cell 414b may then be calculated as a function of vapor pressure, or by extension, temperature. This may be seen in FIG. 5, which depicts potassium cell transmission spectrum 500. As may be seen, to get a cell transmission, or blocking of $10^4$, a cell temperature of approximately 350 K is required.

The third detector channel 416b provided by optical receiver 400b may be operable to detect the potassium filtered third return signal component. The potassium filtered return signal component may correspond to elastic backscatter, filtered for clouds and aerosols. In order to determine the backscatter ratio, the signal received at the second detector channel 412b may be used to determine the total backscatter signal.

When used with beam transmitter 200b, potassium cell 414b may help provide for a backscatter ratio measurement without a need to calibrate via magnet-induced hyperfine splitting based on the Zeeman effect, as is sometimes required when using rubidium cell 414a. Instead, the calibration for potassium cell 414b may be provided using the wavelength of online laser 202b because, in the design of beam transmitter 200b, both online laser 202b and offline laser 204b use the same amplifier 222b. Therefore, a measurement to measurement calibration may be performed using the returned signal from online laser 202b that is not altered in any way from potassium cell 414b. Because signal from online laser 202b is received at second detector channel 412b and third detector channel 416b, and none of it is lost in optical receiver 400b, it is also possible to select a wide variety of components to use as second splitter 408b.

In an embodiment of optical receiver 400b, the following parameters from Table III may be used for first filter 404b and second filter 410b.

TABLE III

| Component | Parameter | Value |
|---|---|---|
| First filter 404b | Etalon Free Spectral Range | 43 GHz |
| First filter 404b | Etalon Bandwidth | 0.65 GHz |
| First filter 404b | Broadband Filter FWHM | <1 nm |
| First filter 404b | Out of Band Blocking | $10^{-14}$ |
| Second filter 410b | Etalon | 158.12 GHz |
| Second filter 410b | Etalon Bandwidth | 4.16 GHz |
| Second filter 410b | First Broadband Filter FWHM | 1 nm |
| Second filter 410b | Second Broadband Filter FWHM | 1 nm |
| Second filter 410b | First Broadband Filter Out of Band Blocking | $10^4$ |
| Second filter 410b | Second Broadband Filter Out of Band Blocking | $10^4$ |

In embodiments, optical receiver 400a, 400b may include multi-channel scalar 424. In examples, multi-channel scalar 424 may include three or four counters.

Figure 6:
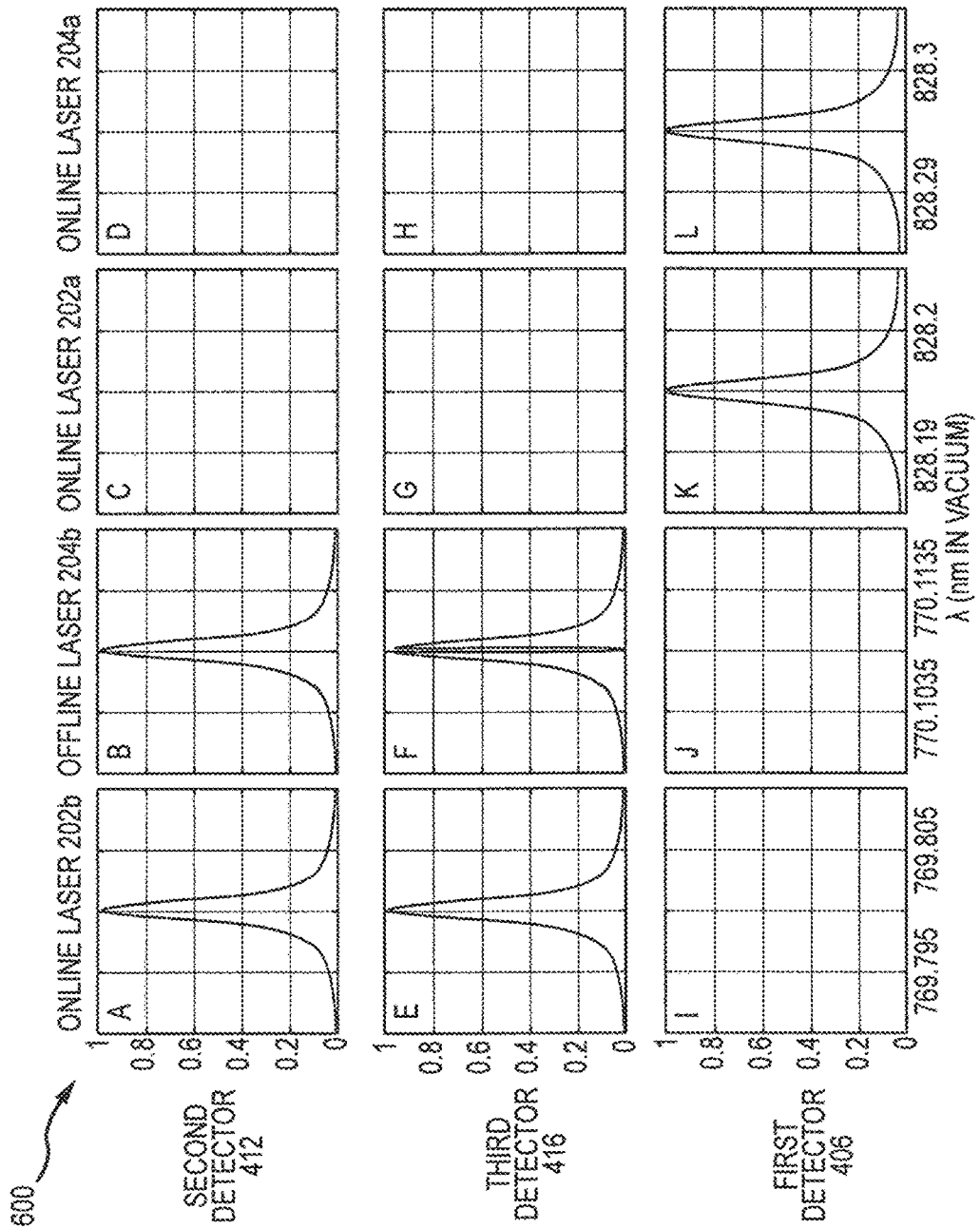
FIG. 6 depicts normalized transmission functions 600, in accordance with an embodiment.

FIG. 6 depicts example normalized transmission functions 600. Normalized transmission functions 600 represent estimates of the signal transmission to first, second, and third detectors 406a, 406b, 412a, 412b, 416a, 416b for optical receiver 400b when using all four lasers of beam transmitter 100b, including online laser 202a, offline laser 204a, online laser 202b, and offline laser 204b. Boxes A, B, E, F, K, and L are designed measurement channels. Boxes C, D, G, H, I, and J represent possible error sources due to unwanted signal leaks but are largely mitigated through strong out of band blocking. The window width for all of boxes A-L is 20 pm.

The shapes of the transmission functions of boxes A, B, E, F, K, and L are primarily determined by the passband of the etalon in the related filter. In further embodiments, out of band blocking may be provided to some extent by the coatings selected and the dichroic optic in any of first, second, or third splitters 402a, 402b, 408a, 408b, 420. In further embodiments, out of band blocking may be determined by narrowband interference filters associated with first, second or third filters 404a, 404b, 410a, 410b, 418.

The embodiments of this application combine the features of a High Spectral Resolution LIDAR (HSRL) instrument with a DIAL instrument to measure the aerosol to total backscatter ratio directly while simultaneously measuring the water vapor concentration and oxygen absorption. The combined HSRL and water vapor and O2 DIAL data allow for temperature retrievals that are more accurate than those previously known in the art.

The detailed descriptions of the above examples are not exhaustive descriptions of all examples contemplated by the inventors to be within the scope of the Application. Indeed, persons skilled in the art will recognize that certain elements of the above-described examples may variously be combined or eliminated to create further examples, and such further examples fall within the scope and teachings of the Application. It will also be apparent to those of ordinary skill in the art that the above-described examples may be combined in whole or in part to create additional examples within the scope and teachings of the Application. Accordingly, the scope of the Application should be determined from the following claims.

What is claimed is:

1. A beam transmitter (200b) for a LIDAR (100b), the beam transmitter (200b) comprising:
   a differential absorption LIDAR transmission channel (201a) operable to provide a water vapor concentration signal comprising:
      a first online laser (202a) operable to produce a first online laser signal;
      a first offline laser (204a) operable to produce a first offline laser signal;
   a first laser transmission selection switch (214a) operable to toggle between including the first online laser signal and the first offline laser signal in a first transmission beam;
   a high spectral resolution LIDAR/temperature sensitive differential absorption LIDAR transmission channel (201b) operable to provide an aerosol backscatter/oxygen absorption signal, comprising:
      a second online laser (202b) operable to produce an online temperature sensitive absorption laser signal;
      a second offline laser (204b) operable to produce a high spectral resolution LIDAR signal and an offline molecular species signal;
   a second laser transmission selection switch (214b) operable to toggle between including the second offline laser signal and the second online laser signal in a second transmission beam; and
   at least one light redirection device (232a, 232b) operable to coalign the first transmission beam with the second transmission beam to generate a combined transmission beam.

2. The beam transmitter of claim 1, wherein the first online laser (202b) and the first offline laser (204b) of the differential absorption LIDAR transmission channel (201a) or the second online laser (202b) and the second offline laser (204b) of the high spectral resolution LIDAR/temperature sensitive differential absorption LIDAR transmission channel (201b) have a wavelength difference of 0.5 nanometers or less.

3. A method for transmitting a combined transmission beam for a LIDAR,
   generating a water vapor concentration signal using a differential absorption LIDAR transmission channel comprising:
      producing a first online laser signal using a first online laser;
      producing a first offline laser signal using a first offline laser;
      toggling between including the first online laser signal and the first offline laser signal in the first transmission beam using a first laser transmission selection switch operable to toggle between including the first online laser signal and the first offline laser signal in the first transmission beam;
   generating an aerosol backscatter/oxygen absorption signal using a high spectral resolution LIDAR/temperature sensitive differential absorption LIDAR transmission channel comprising:
      producing an online temperature sensitive absorption laser signal using a second online laser;

producing a high spectral resolution LIDAR laser signal and an offline molecular species laser signal using a second offline laser;
toggling between including the second online laser signal and the second offline laser signal in the aerosol backscatter/oxygen absorption signal using a second laser transmission selection switch operable to toggle between including the second online laser signal and the second offline laser signal in the aerosol backscatter/oxygen absorption signal; and
coaligning the first transmission beam and the second transmission beam using at least one light redirection device to create the combined transmission beam.

4. The method of claim 3, wherein the first online laser and the first offline laser of the differential absorption LIDAR transmission channel, or the second online laser and the second offline laser of the high spectral resolution LIDAR/temperature sensitive differential absorption LIDAR transmission channel have a wavelength difference of 0.5 nanometers or less.

5. A receiver for a LIDAR, the receiver comprising:
a first splitter (402b) operable to separate a differential absorption LIDAR return signal component and a high spectral resolution LIDAR/temperature sensitive absorption laser remainder return signal from a combined high spectral resolution LIDAR/temperature sensitive absorption laser and differential absorption LIDAR return signal;
a first filter (404b) operable to generate a filtered differential absorption LIDAR return signal component from the differential absorption LIDAR return signal component;
a first detector channel (406b) operable to detect a differential absorption LIDAR online return signal component and a differential absorption LIDAR offline return signal component from the filtered differential absorption LIDAR return signal component corresponding to a water vapor concentration signal;
a second splitter (408b) for separating a temperature sensitive absorption laser return signal component and a high spectral resolution LIDAR/molecular species return signal component from the high spectral resolution LIDAR/temperature sensitive absorption laser remainder return signal;
a second filter (410b) operable to generate a filtered temperature sensitive absorption laser return signal component from the temperature sensitive absorption laser return signal component; and
a second detector channel (412b) operable to detect a temperature sensitive absorption laser return signal component corresponding to an oxygen absorption signal.

6. The receiver of claim 5, further comprising:
a potassium cell (414b) configured to filter the high spectral resolution LIDAR return signal component to generate a filtered potassium high spectral resolution LIDAR return signal component;
a third detector channel (416b) operable to detect the filtered potassium high spectral resolution LIDAR return signal component corresponding to an elastic backscatter signal, filtered for clouds and aerosols.

7. A receiver as claimed in claim 5, wherein at least one of the first filter or the second filter further comprises:
a first narrow band filter;
an etalon; and
a second narrow band filter.

8. A receiver as claimed in claim 5, wherein at least one of the first detector or the second detector further comprises:
a single photon module counting module.

9. A receiver as claimed claim 5, further comprising:
a multi-channel scaler (424) for receiving at least a signal from the first detector or the second detector.

10. A method for receiving a combined signal for a LIDAR, the method comprising:
separating a differential absorption LIDAR return signal component and a high spectral resolution LIDAR/temperature sensitive absorption laser remainder return signal from a combined high spectral resolution LIDAR/temperature sensitive absorption laser and differential absorption LIDAR return signal using a first splitter;
filtering a filtered differential absorption LIDAR return signal component from the differential absorption LIDAR return signal component using a first filter;
detecting a differential absorption LIDAR online return signal component and a differential absorption LIDAR offline return signal component from the filtered differential absorption LIDAR return signal component corresponding to a water vapor concentration signal using a first detector channel comprising a photon counting module;
separating a temperature sensitive absorption laser return signal component and a high spectral resolution LIDAR/molecular species return signal component from the high spectral resolution LIDAR/temperature sensitive absorption laser remainder return signal using a second splitter;
filtering a filtered temperature sensitive absorption laser return signal component from the temperature sensitive absorption laser return signal component using a second filter; and
detecting a temperature sensitive absorption laser return signal component corresponding to an oxygen absorption signal using a second detector channel comprising a photon counting module.

11. A method as claimed in claim 10, further comprising:
filtering the high spectral resolution LIDAR return signal component to generate a filtered potassium high spectral resolution LIDAR return signal component, using a potassium cell;
detecting the filtered potassium high spectral resolution LIDAR return signal component corresponding to an elastic backscatter signal, filtered for clouds and aerosols with a third detector channel.

12. A method as claimed claim 10, wherein at least one of the first filter or the second filter further comprises:
a first narrow band filter;
an etalon; and
a second narrow band filter.

13. A method as claimed in claim 10, further comprising:
a multi-channel scaler for receiving at least a signal from the first detector or the second detector.

14. A beam transmitter (200a) for a LIDAR (100a), the beam transmitter (200a) comprising:
a differential absorption LIDAR transmission channel (201a) operable to provide a water vapor concentration signal comprising:
a first online laser (202a) operable to produce a first online laser signal;
a first offline laser (204a) operable to produce a first offline laser signal;

a first laser transmission selection switch (214*a*) operable to toggle between including the first online laser signal and the first offline laser signal in a first transmission beam;

a temperature sensitive differential absorption LIDAR transmission channel (201*b*) operable to provide an oxygen absorption concentration signal, comprising:
  a second online laser (202*b*) operable to produce an online temperature sensitive absorption laser signal;
  a second offline laser (204*b*) operable to produce an offline molecular species signal;

a second laser transmission selection switch (214*b*) operable to toggle between including the second offline laser signal or the second online laser signal in a second transmission beam;

a high spectral resolution LIDAR transmission channel (241) operable to determine a backscatter ratio signal, comprising a fifth laser (242) operable to produce a third transmission beam comprising a rubidium locked laser signal; and at least two light redirection devices (232*a*, 232*b*, 232*c*) operable to coalign the first transmission beam with the second transmission beam with the third transmission beam to generate a combined transmission beam.

15. The beam transmitter of claim 14, wherein the first online laser (202*a*) and the first offline laser (204*a*) of the differential absorption LIDAR transmission channel (201*a*), or the second online laser (202*b*) and the second offline laser (204*b*) of the temperature sensitive differential absorption LIDAR transmission channel (201*b*) have a wavelength difference of 0.5 nanometers or less.

16. A receiver for a LIDAR, the receiver comprising:
  a first splitter (402*a*) operable to separate a differential absorption LIDAR return signal component from a temperature sensitive differential absorption LIDAR return signal component and a rubidium locked high spectral resolution LIDAR remainder return signal;
  a first filter (404*a*) operable to generate a filtered differential absorption LIDAR return signal component from the differential absorption LIDAR return signal component;
  a first detector channel (406*a*) comprising a photon counting module, and operable to detect a differential absorption LIDAR online return signal component and a differential absorption LIDAR offline return signal component from the filtered differential absorption LIDAR return signal component corresponding to a water vapor concentration signal;
  a second splitter (408*a*) for separating a temperature sensitive absorption laser return signal component from the rubidium locked high spectral resolution LIDAR return signal component;
  a second filter (410*a*) operable to generate a filtered temperature sensitive absorption laser return signal component from the temperature sensitive absorption laser return signal component;
  a second detector channel (412*a*) comprising a photon counting module, and operable to detect a temperature sensitive absorption laser return signal component corresponding to an oxygen absorption signal.

17. The receiver for a LIDAR of claim 16, wherein at least one of the first detector channel or the second detector channel or the third detector channel further comprises a single photon module counting module.

18. The receiver for a LIDAR of claim 16, further comprising:

a third filter (418)) operable to generate a filtered rubidium locked high spectral resolution LIDAR signal from the rubidium locked high spectral resolution LIDAR remainder return signal;

a third splitter (420) operable to separate a first signal component and a second signal component of the filtered rubidium locked high spectral resolution LIDAR signal;

filtering the differential absorption LIDAR return signal component to generate a filtered differential absorption LIDAR return signal component, using a rubidium cell;

a third detector channel (416*a*) operable to detect the filtered first signal component corresponding to an elastic backscatter signal, filtered for clouds and aerosols;

a fourth detector channel (422*a*) operable to detect the second signal component corresponding to an elastic backscatter signal unfiltered for clouds and aerosols.

19. A method for receiving a combined signal for a LIDAR, the method comprising:
  separating a differential absorption LIDAR return signal component from a temperature sensitive differential absorption LIDAR return signal component and a rubidium locked high spectral resolution LIDAR remainder return signal using a first splitter;
  filtering a filtered differential absorption LIDAR return signal component from the differential absorption LIDAR return signal component using a first filter;
  detecting a differential absorption LIDAR online return signal component and a differential absorption LIDAR offline return signal component from the filtered differential absorption LIDAR return signal component corresponding to a water vapor concentration signal, using a first detector channel comprising a photon counting module;
  separating a temperature sensitive absorption laser return signal component from the rubidium locked high spectral resolution LIDAR return signal component using a second splitter;
  filtering a filtered temperature sensitive absorption laser return signal component from the temperature sensitive absorption laser return signal component using a second filter;
  detecting a temperature sensitive absorption laser return signal component corresponding to an oxygen absorption signal using a second detector channel comprising a photon counting module;
  filtering a filtered rubidium locked high spectral resolution LIDAR signal from the rubidium locked high spectral resolution LIDAR remainder return signal using a third filter (418);
  separating a first signal component and a second signal component of the filtered rubidium locked high spectral resolution LIDAR signal using a third splitter;
  filter the first single component to generate a filtered first signal component using a rubidium cell;
  detecting the filtered first signal component corresponding to an elastic backscatter signal, filtered for clouds and aerosols using a third detector channel;
  detecting the second signal component corresponding to an elastic backscatter signal unfiltered for clouds and aerosols using a fourth detector channel.

20. The method for receiving a combined signal for a LIDAR of claim 19, comprising a multi-channel scaler for receiving at least a signal from the first detector channel or the second detector channel.

21. A method for transmitting a combined transmission beam for a LIDAR, generating a water vapor concentration signal using a differential absorption LIDAR transmission channel comprising:

producing a first online laser signal using a first online laser;

producing a first offline laser signal using a first offline laser;

toggling between including the first online laser signal and the first offline laser signal in the first transmission beam using a first laser transmission selection switch operable to toggle between including the first online laser signal and the first offline laser signal in the first transmission beam;

generating an oxygen absorption concentration signal using a temperature sensitive differential absorption LIDAR transmission channel, comprising:

producing an online temperature sensitive absorption laser signal using a second online laser;

producing an offline molecular species signal laser signal using a second offline laser;

using a second laser transmission selection switch operable to toggle between including the second online laser signal and the second offline laser signal in oxygen absorption concentration signal; and determining a backscatter ratio signal using a high spectral resolution LIDAR transmission channel;

producing a third transmission beam comprising a rubidium locked laser signal with a fifth laser; and coaligning the first transmission beam with the second transmission beam with the third transmission beam to generate a combined transmission beam using at least two light redirection devices.

* * * * *